US009478743B2

(12) United States Patent
Lee et al.

(10) Patent No.: US 9,478,743 B2
(45) Date of Patent: Oct. 25, 2016

(54) PEDOT:PSS BASED ELECTRODE AND METHOD FOR MANUFACTURING THE SAME

(71) Applicant: GWANGJU INSTITUTE OF SCIENCE AND TECHNOLOGY, Gwangju (KR)

(72) Inventors: Kwanghee Lee, Gwangju (KR); Seoung-Ho Lee, Gwangju (KR); Nara Kim, Gwangju (KR); Seyoung Kee, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 14/585,803

(22) Filed: Dec. 30, 2014

(65) Prior Publication Data
US 2016/0064672 A1  Mar. 3, 2016

(30) Foreign Application Priority Data

Sep. 2, 2014  (KR) .......................... 10-2014-0115955

(51) Int. Cl.
*H01L 51/00* (2006.01)
*H01L 51/52* (2006.01)
*H01L 51/44* (2006.01)

(52) U.S. Cl.
CPC ......... *H01L 51/0021* (2013.01); *H01L 51/442* (2013.01); *H01L 51/5206* (2013.01); *H01L 51/0037* (2013.01); *Y02E 10/549* (2013.01)

(58) Field of Classification Search
CPC ........... H01L 51/0021; H01L 51/5206; H01L 51/442; H01L 51/0037; Y02E 10/549
See application file for complete search history.

(56) References Cited

FOREIGN PATENT DOCUMENTS

WO    WO2012158125 A1 * 11/2012   ......... H01L 51/0028

OTHER PUBLICATIONS (Supportive Materials) Seyoung Kee et al., Conductive PEDOT:PSS Nanofibrils Induced by Solution-Processed Crystallization and Application for a Transparent Electrode, Apr. 3, 2014, 11 pages, Korea Photovoltaic Society, EXCO.
(Supportive Materials) Lee Kwanghee et al., Development of printed plastic transparent electrode having enhanced electrical conductivity, Apr. 10, 2014, 23 pages, GIST.
(Supportive Materials) National Research Foundation of Korea, Development of printed plastic transparent electrode having enhanced electrical conductivity, Apr. 11, 2014, 5 pages.
(Supportive Materials) The Ministry of Science, ICT and Future Planning, Development of printed plastic transparent electrode having enhanced electrical conductivity, Apr. 14, 2014, 16 pages.

(Continued)

*Primary Examiner* — John P Dulka
*Assistant Examiner* — Charles R Peters
(74) *Attorney, Agent, or Firm* — Hauptman Ham, LLP

(57) ABSTRACT

The present disclosure provides a method for fabricating a PEDOT:PSS-based electrode, comprising the steps of: preparing a PEDOT:PSS thin film formed on a substrate; treating the thin film with a solution containing 75-100 vol % of sulfuric acid or a sulfuric acid derivative; separating the thin film from the solution and rinsing the separated thin film; and drying the rinsed thin film at a temperature between 60° C. and 160° C. The present disclosure also provides a PEDOT:PSS-based electrode fabricated by the method, and an organic electronic device including the electrode.

10 Claims, 13 Drawing Sheets

(56) References Cited

OTHER PUBLICATIONS (Supportive Materials) Lee Kwanghee, Improvement in printed plastic transparent electrode, Apr. 25, 2014, 11 pages, The Science Times.

(Supportive Materials) Nara Kim et al., Highly Conductive PEDOT:PSS Nanofibrils Induced by Solution-Processed Crystallization, Jul. 1, 2014, 20 pages, GIST.

(Supportive Materials) New & Renewable Energy Journal, Jun. 1, 2014, 16 pages.

(Supportive Materials) Kwanghee Lee, Development of Printed Plastic Transparent Electrode Having Enhanced Electrical Conductivity, May 30, 2014, The Science & Technology.

Yijie Xia et al., Solution-Processed Metallic Conducting Polymer Films as Transparent Electrode of Optoelectronic Devices, 2012, pp. 2436-2440, vol. 24, Wiley-VCH Verlag GmbH & Co. KGaA, Weinheim.

* cited by examiner (a)          (b)          (c)

(a)

(b)

PEDOT:PSS BASED ELECTRODE AND METHOD FOR MANUFACTURING THE SAME

CROSS REFERENCE TO RELATED APPLICATION

This application claims the benefit of Korean Patent Application No. 10-2014-0115955, filed on Sep. 2, 2014, entitled "PEDOT:PSS BASED ELECTRODE AND METHOD FOR MANUFACTURING THE SAME", which is hereby incorporated by reference in its entirety into this application.

BACKGROUND

1. Technical Field

The present disclosure relates to a (poly(3,4-ethylenedioxythiophene:poly(styrenesulfonate) (hereinafter referred to as PEDOT:PSS)-based electrode and a fabrication method thereof. More particularly, the present disclosure relates to a PEDOT:PSS-based electrode having improved electrical conductivity, a method for fabricating the same, and an organic electronic device having the same.

2. Related Art

Flexible electronic devices are light and flexible, and thus are an aggregate of science and technology, which can be advantageously used in ubiquitous environments. One of the most important factors in the development of such electronic devices is the development of plastic transparent electrodes. Transparent electrodes are used in various applications, including flat panel displays such as LCDs, PDPs and OLEDs, touch screens, thin film solar cells, etc.

The most representative transparent electrode that is currently used is an indium tin oxide (ITO) electrode showing excellent optical and electrical properties. However, ITO is difficult to use in the field of next-generation flexible devices, due to its brittleness. Also, it requires high-temperature deposition, and for this reason, there has been a limit to fabricating high-performance transparent electrodes using ITO by printing processes. In addition, because the reserves of indium that is the main component of ITO are very small, the price thereof is rising. Thus, there is an urgent need for the development of new transparent electrodes.

As transparent electrode materials to substitute for ITO, carbon nanotubes, graphene, silver nanowires, metal oxides and the like have been much studied. However, plastic transparent electrodes developed to date have significantly low electrical conductivity, and thus there is an urgent need to overcome this shortcoming. As other transparent electrode materials to substitute for ITO, electrically conductive polymers comprising organic compounds have advantages including processability, lightweight, flexibility, a simple coating process, low production costs, etc., which are the advantages of general plastics, while these polymers are electrically conductive like metals, and show high transmittance in the visible region. Thus, these polymers are receiving attention as an alternative to ITO. In addition, conventional alternative materials comprising organic compounds necessarily require an expensive complex deposition process to form electrodes having an electrical conductivity comparable to that of ITO, whereas electrically conductive polymers have an advantage in that these can be formed into electrodes using a low-temperature solution process.

However, the relatively low electrical conductivity of electrically conductive polymers made it difficult to substitute these electrically conductive polymers for ITO.

PEDOT:PSS (poly(3,4-ethylenedioxythiophene):poly (styrenesulfonate), a kind of representative electrically conductive polymer, has high conductivity, and high transmittance in the visible region, and is soluble in water so that a solution process can be applied thereto in an environmentally friendly manner. In addition, it has high stability, and is one of electrically conductive plastic materials that are being most widely used (FIG. 1). However, it has an electrical conductivity of 1 S/cm, which is too low to use it as a transparent electrode and is significantly lower than that of ITO (>5,000 S/cm).

For past several decades, many studies on the optical and electrical properties of PEDOT:PSS have been conducted, and there have been attempts to improve the electrical conductivity using various organic solvents or surfactants or by acid treatment.

According to non-patent document 1 (Yijie Xia, Kuan Sun, and Jianyong Ouyang, Solution-Processed Metallic Conducting Polymer Films as Transparent Electrode of Optoelectronic Devices, Advanced Materials 2012, 24, 2436-2440) published recently, there is a report that an electrical conductivity of 3,065 S/cm was obtained by dropping a 1.0 M sulfuric acid ($H_2SO_4$) solution onto a PEDOT:PSS thin film. However, non-patent document 1 did not suggest a specific mechanism for improvement in the electrical conductivity of the thin film and an optimum fabrication method, and did not realize electrical properties comparable to those of ITO. Thus, the actual commercial use of the technology of non-patent document 1 is limited.

Accordingly, there is a need to develop a transparent electrode showing electrical properties comparable to those of ITO, by providing an optimum fabrication method that improves the electrical conductivity of electrically conductive polymers.

SUMMARY

An aspect of the present disclosure is to intended to provide a PEDOT:PSS-based electrode capable of exhibiting electrical properties comparable to those of ITO while having advantages including processability, lightweight, flexibility, a simple coating process, low production costs, etc., a method for fabricating the electrode, and an organic electronic device including the electrode.

The objects of the present disclosure are not limited to the above-mentioned objects, and other objects not mentioned herein will be clearly understood by those skilled in the art from the following description.

In one aspect, the present disclosure provides a method for fabricating a PEDOT:PSS-based electrode, including the steps of: preparing a PEDOT:PSS thin film formed on a substrate; treating the thin film with a solution containing 75-100 vol % of sulfuric acid or a sulfuric acid derivative; separating the thin film from the solution and rinsing the separated thin film; and drying the rinsed thin film at a temperature between 60° C. and 160° C.

In another aspect, the present disclosure provides a PEDOT:PSS-based electrode including: a substrate; and an electrode composed of a PEDOT:PSS thin film formed on the substrate, wherein the PEDOT:PSS thin film has a molar ratio of PEDOT to PSS of 1.6-2.0 and a degree of crystallinity of 40% or higher.

In still another aspect, the present disclosure provides an organic electronic device having a PEDOT:PSS-based electrode, the organic electronic device including: a substrate; a first electrode composed of a PEDOT:PSS thin film formed on the substrate; a photoactive layer disposed on the first electrode; and a second electrode disposed on the photoactive layer, wherein the PEDOT:PSS thin film has a molar ratio of PEDOT to PSS of 1.6-2.0 and a degree of crystallinity of 40% or higher.

DETAILED DESCRIPTION

Figure 1:
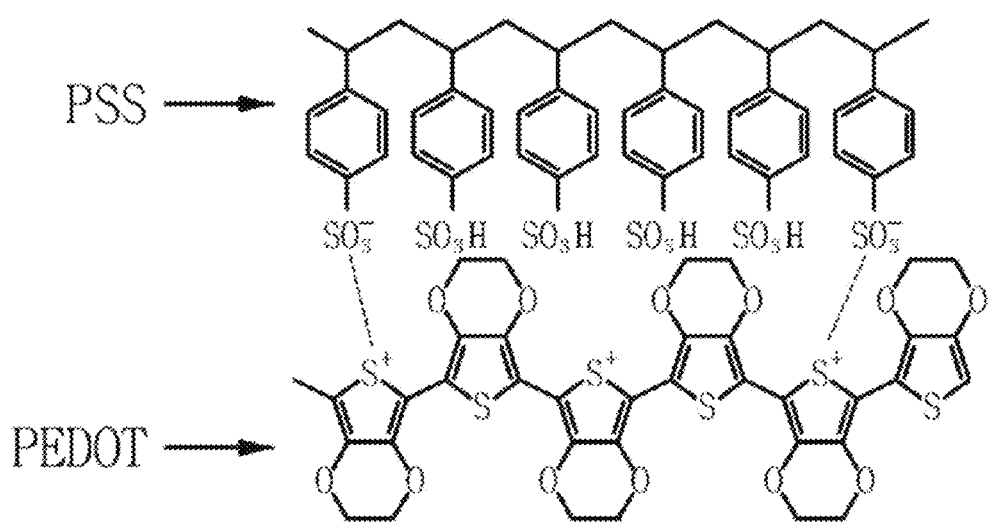
FIG. 1 shows the chemical structure of PEDOT:PSS.

Exemplary embodiments will be described below in more detail with reference to the accompanying drawings. The disclosure may, however, be embodied in different forms and should not be constructed as limited to the embodiments set forth herein. In the drawings, parts irrelevant to the description of the present disclosure are omitted for the simplicity of the description. Throughout the specification, when a first element is referred to as being "on" a second element, it not only refers to a case where the first element comes in contact with the second element but also a case where a third layer exists between the first element and the second element.

Throughout the specification, when any portion "comprises" or "includes" any element, it refers to a case where the portion may further comprise or include other element(s), but does not exclude other element(s), unless otherwise specified.

Terms of approximation, such as "about," "substantially," "approximately," and the like, are used herein in the sense of "at, or nearly at," for example, when given the manufacturing and material tolerances inherent in the stated circumstances, and are used to prevent an unscrupulous infringer from unfairly taking advantage of this disclosure where exact or absolute values are stated as an aid to understanding the disclosure. As used herein, the term "step of performing ~" or "step of ~" does not mean "step for ~".

As used herein, the term "combination of" included in Markush type description means a mixture or combination of one or more components, steps, operations and/or elements selected from the group consisting of components, steps, operations and/or elements described in Markush type, and thus term includes one or more components, steps, operations and/or elements selected from the Markush group.

It should not be understood that the term "consist of", "consisting of", "include", "including", "comprise" or "comprising", as used herein, essentially includes all the elements, components or steps disclosed herein, and it should be understood that the term may not include some of the components or steps, and may further include additional components or steps.

"%" as used herein to indicate the concentration of sulfuric acid or a sulfuric acid derivative is by volume unless otherwise indicated.

The present disclosure is directed to a technology that post-treats (poly(3,4-ethylenedioxythiophene):poly(styrenesulfonate) (hereinafter referred to as PEDOT:PSS), a type of electrically conductive polymer, with sulfuric acid or a sulfuric acid derivative, thereby significantly improving electrical properties, such as low electrical conductivity that has been pointed out as the shortcoming of the electrically conductive polymer, so as to enable the polymer to be used as an electrode instead of ITO. A process of post-treating PEDOT:PSS with sulfuric acid or a sulfuric acid derivative is schematically shown in FIG. 2b.

First, a PEDOT:PSS thin film formed on a substrate is prepared.

Poly(3,4-ethylenedioxythiophene) (PEDOT), a polythiophene-based electrically conductive polymer, has a high electrical conductivity of $10^3$-$10^6$ S/cm, but has a problem of poor processability due to its water insolubility. To overcome this problem, PEDOT is doped with anionic poly (styrenesulfonate) (PSS) to form a PEDOT/PSS complex, which can be present as a stable dispersion in water and has a very high thermal stability. In addition, to maintain the optimal dispersibility of PEDOT in water, the solid concentration of PEDOT and PSS is controlled in the range of 1.0-1.5 wt %. Additionally, PEDOT is readily mixed with water, alcohol or a solvent having a high dielectric constant, and thus can be easily coated after dilution with the solvent. Also, when PEDOT is formed into a coating film, it shows high transparence compared to other electrically conductive polymers such as polyanilines, polypyrroles or the like.

Meanwhile, the PEDOT:PSS thin film may be formed on the substrate by a dry process or a wet process. Examples of the dry process include a sputtering process, an evaporation process, etc., and examples of the wet process include a dip coating process, a spin coating process, a roll coating process, a spray coating process, etc. Preferably, PEDOT:PSS mixed with a solvent such as water, alcohol or acetonitrile is coated on the substrate by a wet process, in terms of printability, fabrication costs and low-temperature process possibility.

The final PEDOT:PSS thin film preferably has a thickness between 30 nm (light transmittance: 94%, and sheet resistance: 80 Ω/sq) and 105 nm (light transmittance: 83%, and sheet resistance: 26 Ω/sq), which is advantageous in terms of reducing the sheet resistance thereof.

The substrate may be selected from the group consisting of glass, quartz, $Al_2O_3$ and SiC, but is not limited thereto. Preferably, it is glass that does not corrode even under a highly acidic condition as described below.

The PEDOT:PSS thin film prepared as described above is treated with a solution containing 75-100 vol % of sulfuric acid or a sulfuric acid derivative. In addition to sulfuric acid or a sulfuric acid derivative, the solution may contain water, alcohol, acetonitrile, or a mixture of two or more thereof, but is not limited thereto. The process of treating the thin film with the solution may be performed by exposing the thin film to the solution using a spray process, an application process, an immersion process, etc. Among these processes, the immersion process is preferable in terms of the convenience of the process and the maximization of reaction efficiency. Hereinafter, the present disclosure will be described by an example of a method that uses the immersion process as the process of treating the thin film.

The sulfuric acid or sulfuric acid derivative that is used to treat the thin film include may be a compound containing $-SO_3^-$ or $-SO_3H$, but is not limited thereto. The PSS moiety of PEDOT:PSS contains $-SO_3^-$ or $-SO_3H$, and when sulfuric acid or a sulfuric acid derivative, which as a functional group similar to $-SO_3^-$ or $-SO_3H$, it will easily interact with PEDOT:PSS. Specifically, the sulfuric acid or sulfuric acid derivative that is used to treat the thin film may be selected from the group consisting of methansulfonic acid, trifluoromethansulfonic acid, sulfuric acid, perchloric acid, benzenesulfonic acid, p-toluenesulfonic acid, 4-ethyl-benzenesulfonic acid, 4-sulfophthalic acid, p-xylene-2-sulfonic acid hydrate, 5-amino-1-naphthalenesulfonic acid, 8-amino-2-naphthalenesulfonic acid, 4-amino-2-naphthalenesulfonic acid, taurine, 1,4-butanedisulfonic acid, sulfurous acid, bis(trifluoromethane)sulfonamide, and a mixture of two or more thereof, but is not limited thereto. However, for the convenience of description, a reaction mechanism that uses sulfuric acid as a representative example will be described herein.

Figure 2A:
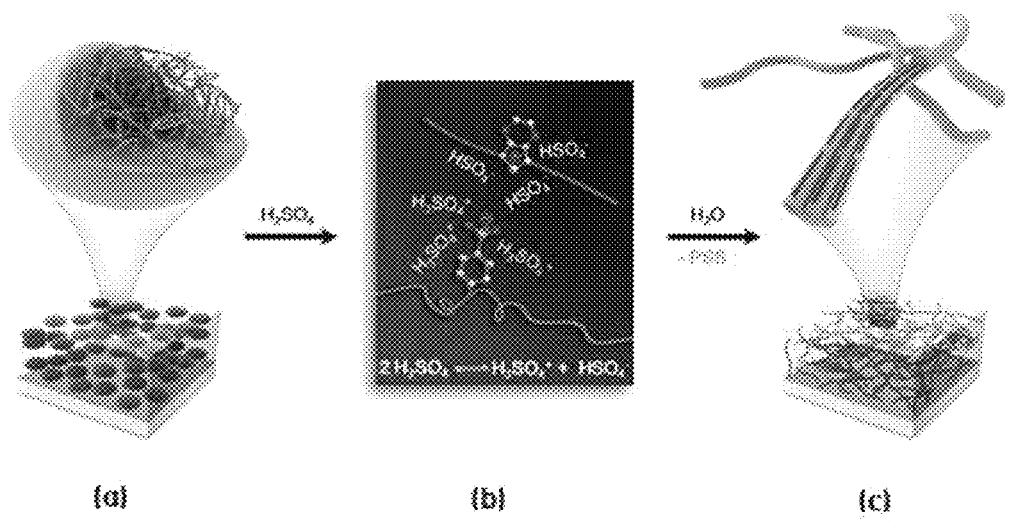
FIG. 2a is a schematic view illustrating the rearrangement of a PEDOT:PSS structure by treatment with high-concentration sulfuric acid and a mechanism by which the electrical conductivity of the PEDOT:PSS structure is improved by the rearrangement.
Figure 2B:
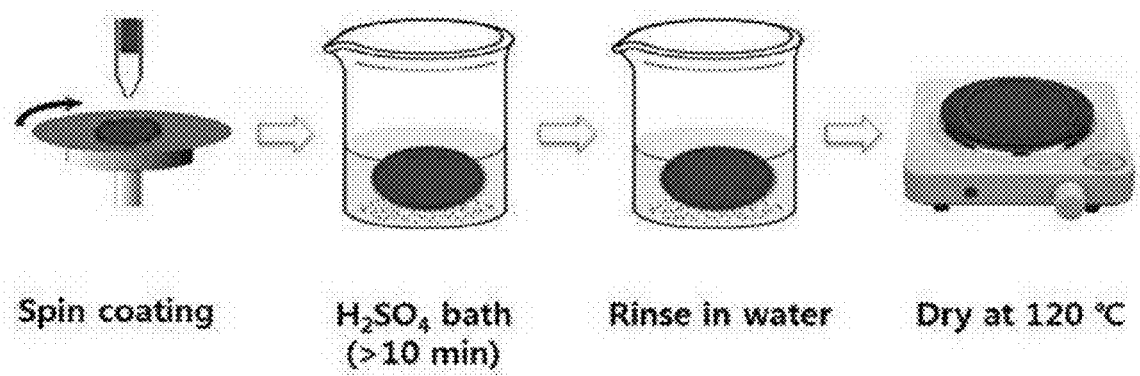
FIG. 2b shows a method of post-treating a PEDOT:PSS thin film with sulfuric acid according to an embodiment of the present disclosure.

Referring to FIG. 2a, a high concentration of sulfuric acid ($H_2SO_4$) undergoes autoprotolysis so that two sulfuric acid ($H_2SO_4$) molecules will produce two ions as shown in the following equation:

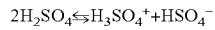
$2H_2SO_4 \leftrightharpoons H_3SO_4^+ + HSO_4^-$

In the case of PEDOT:PSS, the anionic PSS is present around the electrically conductive PEDOT polymer by the intermolecular force therebetween. This PSS functions to increase the dispersibility of PEDOT in a solvent by preventing the stacking of PEDOT. However, a problem may arise in that PSS having low electrical conductivity forms a non-electrically conductive molecular chain around PEDOT to reduce the overall electrical conductivity of an electrode formed of PEDOT:PSS. If the treatment of PEDOT:PSS with a solution containing a ultrahigh concentration of sulfuric acid is performed according to the present disclosure, anionic $HSO_4^-$ will surround PEDOT, and cationic $H_3SO_4^+$ will surround PSS, and thus the intermolecular force between PEDOT and PSS will be reduced, thereby inducing a "charge-separated transition state".

Specifically, if PEDOT:PSS is treated with an ultrahigh concentration of $H_2SO_4$, the above-described two ions will stabilize the state of separation between positively charged PEDOT separated and negatively charged PSS. In this case, a dense PEDOT network will be formed due to the strong π-π stacking of PEDOT and the rigidity of the backbone, and amorphous PEDOT:PSS grains will be formed into crystalline nanofibril structures, resulting in a significant change in the crystalline structure and shape of PEDOT:PSS. Consequently, the structural rearrangement of PEDOT:PSS into crystalline PEDOT:PSS nanofibrils will occur.

The time during which the PEDOT:PSS thin film is immersed in the solution may vary depending on the kind and concentration of sulfuric acid or sulfuric acid derivative. However, as shown in Table 1 below, 100 vol % of sulfuric acid showed good electrical conductivity without a significant change in the performance of the fabricated PEDOT:PSS thin film even when the immersion time changed in the range from 1 minute to 1000 minutes. Thus, it is believed that an immersion time of 1 minute or more is sufficient for the reaction. In addition, as confirmed by the inventors of the present invention, even when the thin film was immersed for 1 week, the structural deformation of PEDOT did not occur, and the electrical conductivity thereof was not influenced by the immersion. For this reason, the upper limit of the immersion time is not defined.

In addition, the immersion time can also change depending on the kind or concentration of sulfuric acid derivative. However, if the immersion time is too short, the separation of PSS will be insufficient, and the reproducibility of the reaction will also be reduced.

Further, sulfuric acid or the sulfuric acid derivative is preferably used at a relatively high concentration. An electrode fabricated using an aqueous solution containing 75-100 vol % of sulfuric acid or the sulfuric acid derivative showed relatively good electrical properties. Preferably, a solution containing 80-100 vol % of sulfuric acid or the sulfuric acid derivative is used. Most preferably, an electrode fabricated using a solution containing 100 vol % of sulfuric acid, that is, pure sulfuric acid that contains no solvent such as water, showed the best electrical properties. For reference, when the concentration of sulfuric acid is expressed as moles (M), 70 vol %, 75 vol %, 80 vol % and 100 vol % of sulfuric acid correspond to 13.1M, 14.1 M, 15.0 M and 18.8 M of sulfuric acid, respectively.

In the immersion process, PSS uncoupled from PEDOT:PSS, $H_2SO_4$ or its derivative can be attached to surface of the substrate and the PEDOT:PSS thin film. These attached materials can be removed by rinsing with a sufficient amount of a rinsing agent. The rinsing agent may be water, but is not limited. Preferably, deionized water is used as the rinsing agent. A minimum amount of PSS required for maintaining the PEDOT:PSS structure is reorganized into PEDOT and acts as a counter ion.

PEDOT is an electrically conductive material, whereas PSS is a non-electrically conductive material. Thus, it is believed that the electrical conductivity of the PEDOT:PSS structure can be increased by leaving only a minimum amount of PSS required for maintaining the PEDOT:PSS structure.

It was shown that, when the molar ratio of PEDOT:PSS of the PEDOT:PSS complex before treatment with sulfuric acid was about 1:2.0, the molar ratio of PEDOT:PSS after treatment with 75-100 vol % of sulfuric acid and rinsing was about 1.6-2.0:1, suggesting that the ratio of PSS to PEDOT significantly decreased. It can be seen that this increase in the molar ratio of PEDOT:PSS leads to an increase in the charge density of PEDOT:PSS. The results of a study conducted by the inventors of the present disclosure revealed that a molar ratio of PEDOT:PSS of about 2.0:1 showed the best electrical properties.

Figure 7:
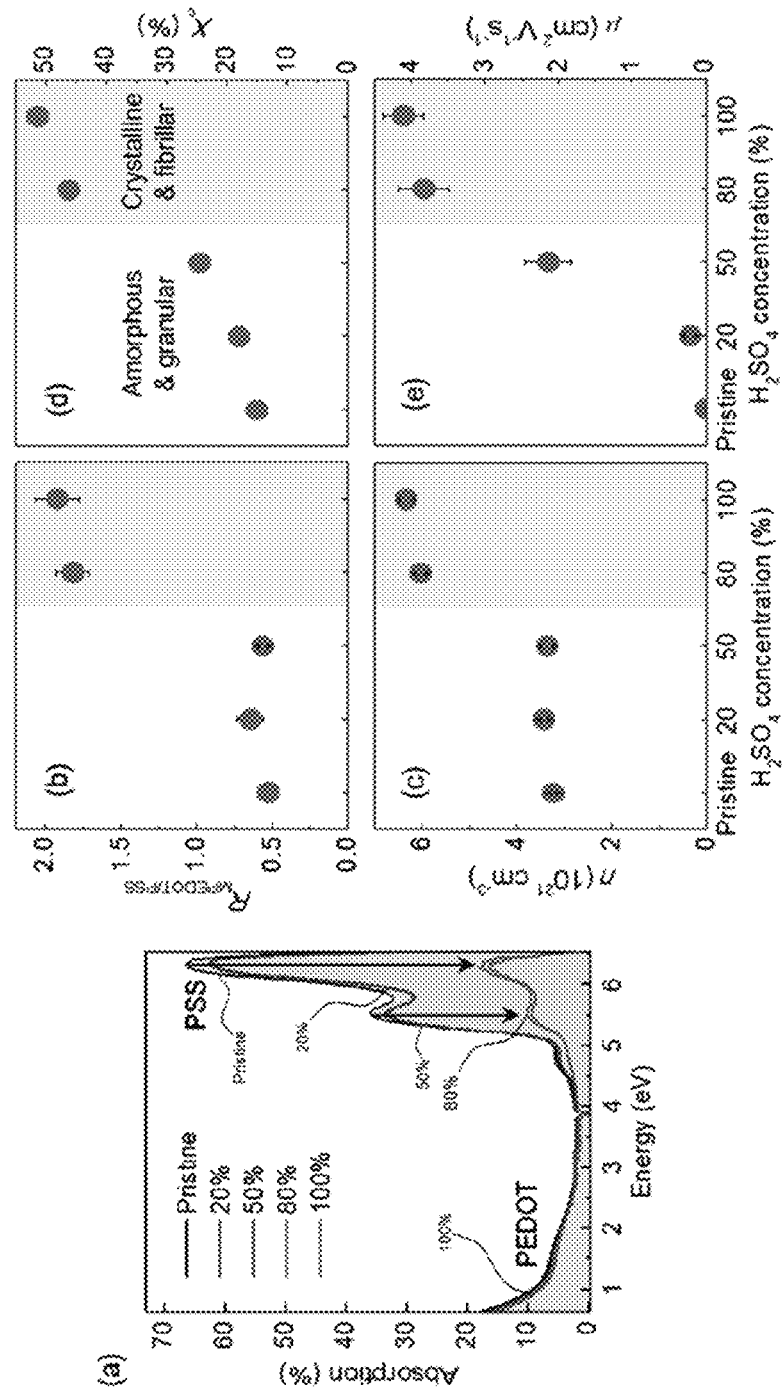
FIG. 7 shows changes in the absorption spectrum (a), molar ratio (b), charge density (c), degree of crystallinity (d) and charge mobility (e) of PEDOT:PSS thin films treated with varying concentrations of sulfuric acid.

In addition, it was shown that, when the degree of crystallinity of PEDOT:PSS in the PEDOT:PSS complex before treatment with sulfuric acid was about 15%, the degree of crystallinity of PEDOT:PSS after treatment with 75-100 vol % of sulfuric acid and rinsing was 40% or more, suggesting that a significant decrease in the ratio of PSS to PEDOT resulted in an increase in the degree of crystallinity of PEDOT:PSS. It can be seen that this increase in the degree of crystallinity of PEDOT:PSS leads to an increase in the charge mobility (FIG. 7).

From the viewpoint of the electrical conductivity of PEDOT:PSS, the degree of crystallinity of PEDOT:PSS is preferably 40% or higher, more preferably 46% or higher, even more preferably 48% or higher, and most preferably 50% or higher. However, the upper limit of the degree of crystallinity is not specifically defined, because the higher degree of crystallinity is better.

The rinsed thin film is dried at a temperature between 60° C. and 160° C.

When the substrate coated with the PEDOT:PSS complex is dried by hot air, or dried in vacuum or dried by infrared (IR) light, an electrode composed of the PEDOT:PSS complex fixed to the substrate is formed.

At sites remaining after PSS has been uncoupled from PEDOT:PSS, sulfuric acid, a sulfuric acid derivative or water may exist. If the substrate is dried at an excessively high temperature, there will be a problem in that this liquid material evaporates before PEDOT is formed into a crystal, and if the substrate is dried at an excessively low temperature, the liquid material will exist between the PEDOT molecules to interfere with the n-n interaction therebetween. However, this problem can be reduced when the drying process is performed for a sufficiently long time (10 minutes or more) at a low temperature.

Figure 11:
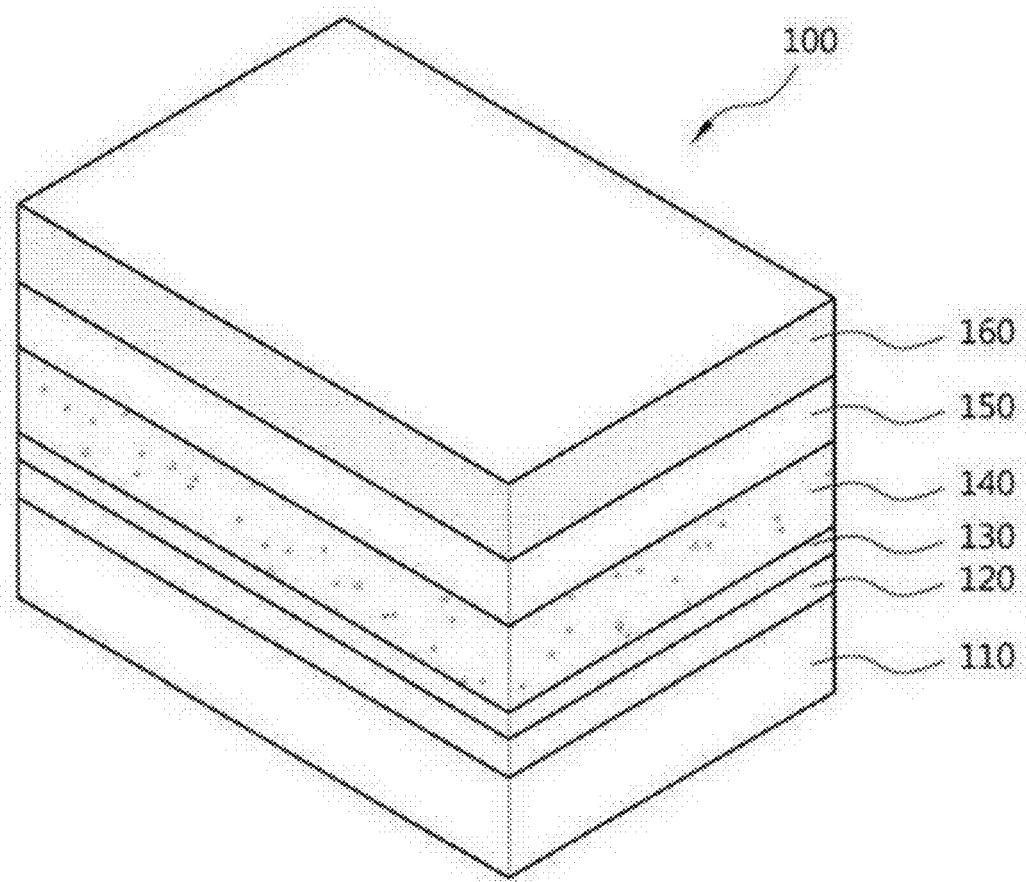
FIG. 11 is a schematic view showing an organic electronic device according to an embodiment of the present disclosure.

FIG. 11 is a schematic view showing an organic electronic device 100 according to an embodiment of the present disclosure.

Referring to FIG. 11, a first electrode 120, a hole transport layer 130, a photoactive layer 140, an electron transport layer 150 and a second electrode may be sequentially formed on a substrate 110. Herein, the hole transport layer 130 and the electron transport layer 150 may not be formed. Further, when PEDOT:PSS according to the present disclosure is used as an anode, there is an advantage in that PEDOT:PSS that functioned as a hole transport layer in a conventional ITO electrode is not required to be provided separately.

The substrate 110 is used to support the organic electronic device, and may be a substrate made of a light-transmitting inorganic material selected from the group consisting of glass, quartz, Al$_2$O$_3$ and SiC, but is not limited thereto. Preferably, the substrate 110 that is used in the present disclosure is made of a material that does not corrode, because a high concentration of strong acid is used in the present disclosure.

The first electrode 120 may be a light-transmitting electrode composed of the PEDOT:PSS thin film fabricated according to the present disclosure. It is an element that substitutes for a conventional ITO (indium tin oxide) film.

The hole transport layer 130 can function either to easily transport holes, supplied from an external circuit, from the first electrode 120 to the photoactive layer 140 (in the case of an organic light-emitting device), or to easily transport holes, generated in the photoactive layer 140, to the first electrode 120 (in the case of an organic solar cell). In addition, the hole transport layer 130 can function as a buffer layer that reduces the surface roughness of the first electrode 120. Furthermore, it can also function as an electron blocking layer that prevents electrons from entering the first electrode 120 from the photoactive layer 140, because the LUMO (lowest unoccupied molecular orbital) level of the hole transport layer 130 is higher than the LUMO level of the photoactive layer 140.

In the case of an organic solar cell, this hole transport layer 130 may be formed of a mixture of poly(styrenesulfonate) (hereinafter referred to as PSS) and poly(3,4-ethylenedioxythiophene (hereinafter referred to as PEDOT), but is not limited thereto.

The hole transport layer 130 of the organic light-emitting device may include one or more selected from among triphenylene-based polymers, parylene-based polymers, pyrene-based polymers, tetracene-based polymers, anthracene-based polymers, NPD-based polymers, TPD-based polymers and photoconductive polymers, but is nit limited thereto.

The photoactive layer 140 may be a light-emitting layer or a photoelectric conversion layer. As used herein, the term "light-emitting layer" refers to a layer that emits light by the combination of electrons and holes, which are supplied from the outside, and the term "photoelectric conversion layer" refers to a layer in which electron-hole pairs (excitons) are produced by externally supplied light and separated into charges. When the photoactive layer 140 is made of a light-emitting layer or a photoelectric conversion layer, the organic electronic device 100 can function as an organic light-emitting device or an organic solar cell.

The material of the light-emitting layer or the photoelectric conversion layer is not specifically limited, and may be selected from among various polymers or small molecular organic materials.

For example, the material of the light-emitting layer may be selected from among polyaniline, polypyrrole, polyacetylene, poly(3,4-ethylenedioxythiophene (PEDOT), polyphenylenevinylene (PPV), polyfluorene, polyparaphenylene (PPP), polyalkylthiophene, polypyridine (PPy), polyvinylcarbazole, and copolymers thereof, or may be selected from among suitable host/dopant materials.

For example, the electron donor material of the photoelectric conversion layer may be polythiophene, polyfluorene, polyaniline, polycarbazole, polyvinylcarbazole, polyphenylene, polyphenylvinylene, polysilane, polyisothianaphthanene, polythiazole, polybenzothiazole, polythiopheneoxide, or a copolymer of two or more thereof. As an example, the electron donor material may be either poly(3-hexylthiophene) (P3HT) that is a type of polythiophene, or PCPDTBT (poly[2,6-(4,4-bis-(2-ethylhexyl)-4H-cyclopenta[2,1-b;3,4-b']dithiophene)-alt-4,7-(2,1,3-benzothiadiazole)], PCDTBT (poly[N-9'-heptadecanyl-2,7-carbazolealt-5,5-(4',7'-di-2-thienyl-2',1',3'-benzothiadiazole)]) or PFDTBT (poly(2,7-(9-(2'-ethylhexyl)-9-hexyl-fluorene)-alt-5,5-(4',7'-di-2-thienyl-2', 1',3'-benzothiadiazole)), which are copolymers of the above-mentioned polymers. In addition, the electron acceptor material of the photoelectric conversion layer may be, for example, $C_{60}$-$C_{84}$ fullerene or its derivative, perylene, a polymer or quantum dots. The fullerene derivative may be PCBM, for example, PCBM($C_{60}$) ([6,6]-phenyl-$C_{61}$-butyric acid methyl ester) or PCBM($C_{70}$) ([6,6]-phenyl-$C_{71}$-butyric acid methyl ester).

The electron transport layer 150 can function either to easily transport electrons, supplied through an external circuit, from the second electrode 160 to the photoactive layer 140 (in the case of an organic light-emitting device), or to easily transport electrons, generated in the photoactive layer 140, to the second electrode 160 (in the case of an organic solar cell). In addition, the electron transport layer 150 can also function as a hole blocking layer that prevents holes generated in the photoactive layer 140 from entering the second electrode 150. This electron transport layer 150 may be, for example, a titanium oxide layer. The titanium oxide layer can function to prevent the device from being deteriorated due to the penetration of oxygen or steam into the photoactive layer 140, and can function not only as an optical spacer that increases the quantity of light to be introduced into the photoactive layer 140, but also as a layer that increases the life span of the organic electronic device. The titanium oxide layer may be formed by a sol-gel process.

The second electrode 160 has a work function lower than that of the first electrode 120, and may be formed of a metal or an electrically conductive polymer. For example, the second electrode 160 may be an electrode formed of any one metal selected from among Li, Mg, Ca, Ba, Al, Cu, Ag, Au, W, Ni, Zn, Ti, Zr, Hf, Cd, Pd, Cs, and alloys thereof. If the second electrode 160 is a metal electrode, it can be formed by thermal vapor deposition, electron beam deposition, sputtering or chemical vapor deposition, or can be formed by applying an electrode forming paste including a metal, followed by thermal treatment, but is not limited thereto.

Hereinafter, the present disclosure will be described in detail with reference to examples. It is to be understood, however, that these examples are for illustrative purposes only and are not intended to limit the scope of the present disclosure.

EXAMPLES

Fabrication Example 1

Fabrication of PEDOT:PSS Thin Film

PEDOT:PSS (Clevios PH1000) was filtered through a hydrophilic syringe filter (0.45 μm) to remove large-sized particles. The filtrate was spin-cast on 2×2 $cm^2$ glass or holey silicon nitride support films for TEM, and dried at 120° C. for 15 minutes, thereby forming a plurality of PEDOT:PSS thin films.

For post treatment, each of the PEDOT:PSS thin films (<100 nm) was immersed in sulfuric acid solutions containing varying concentrations (10-100 vol %) of sulfuric acid ($H_2SO_4$) (Duksan Pure Chemicals, >95%) for varying times (1-1000 minutes) at room temperature.

Thereafter, the thin films were sufficiently rinsed with deionized water, and then dried at varying temperatures (60 to 120° C.) for 10 minutes or more to remove the remaining moisture.

To obtain a distinct XRD pattern, according to the same process as described above, a filtered PEDOT:PSS solution was drop-cast on a silicon substrate to form a PEDOT:PSS thin film (>10 μm). However, the detailed process conditions were controlled as follows: The immersion time was increased to 3 hours, and the solution was dried at 60 to 80° C. for 1 hour, and then at 120° C. for 30 minutes, thereby obtaining the PEDOT:PSS thin film of the present disclosure.

In addition, a PEDOT:PSS thin film was immersed in each of post-treatment solutions that are sulfuric acid derivative solutions other than a sulfuric acid solution, that is, trifluoromethanesulfonic acid ($CF_3SO_3H$) (Sigma-Aldrich Chemical Co., 98%), p-toluenesulfonic acid, bis(trifluoromethane) sulfonamide, benzenesulfonic acid and 4-sulfophthalic acid solutions, for 10 minutes or more under the same remaining conditions as described above, thereby obtaining PEDOT:PSS thin films.

Analysis Example 1

Analysis of Properties of PEDOT:PSS Thin Films

The properties of the PEDOT:PSS thin films fabricated in Fabrication Example 1 were analyzed in the following manner.

The sheet resistance of each thin film was measure by a four-point probe method. A current was applied to each thin film using a Keithley 2400 Source Meter unit, and a drop in the voltage was measured using a HP 34401A multimeter. The thickness of the thin film was measured using a Surfcorder ET-3000 profilometer (Kosaka Laboratory Ltd.). The XRD pattern of each thin film was obtained using a Rigaku D/max-2500 diffractometer, and the TEM image was obtained using a Tecnai $G^2$ F30 S-Twin microscope, and the absorption spectrum was obtained using a Perkin-Elmer Labmda 750 UV/Vis/NIR spectrophotometer. Based on such data, the molar ratio of PEDOT to PSS, the degree of crystallinity and the electrical conductivity of the PEDOT:PSS thin film fabricated under each fabrication condition were determined, and the results are summarized in Table 1 below. However, actual measurement data may be within an error range of ±5% in the data of Table 1, because data set forth for each sample No. can indicate the mean value of measurements for the samples fabricated under the same condition. For example, when the molar ratio of PEDOT to PSS is described to be 1.9, it can also mean about 2.0.

TABLE 1

| Sample No. | Sulfuric acid concentration (vol %) | Treatment temperature (° C.) | Treatment time (min) | Molar ratio of PEDOT to PSS | Degree of crystallinity (%) | Electrical conductivity (S/cm) (mean value) |
|---|---|---|---|---|---|---|
| 1 | pristine | 120 | 10 | 0.53 | 15 | 1.13 |
| 2 | 10 | 120 | 10 | 0.59 | 16 | 70 |
| 3 | 20 | 120 | 10 | 0.65 | 18 | 117 |
| 4 | 30 | 120 | 10 | 0.62 | 20 | 320 |
| 5 | 40 | 120 | 10 | 0.59 | 22 | 730 |

TABLE 1-continued

| Sample No. | Sulfuric acid concentration (vol %) | Treatment temperature (° C.) | Treatment time (min) | Molar ratio of PEDOT to PSS | Degree of crystallinity (%) | Electrical conductivity (S/cm) (mean value) |
|---|---|---|---|---|---|---|
| 6 | 50 | 120 | 10 | 0.56 | 24 | 1150 |
| 7 | 60 | 120 | 10 | 0.78 | 29 | 1420 |
| 8 | 70 | 120 | 10 | 1.3 | 36 | 1890 |
| 9 | 72.5 | 120 | 10 | 1.4 | 38 | 2030 |
| 10 | 75 | 120 | 10 | 1.6 | 40 | 2400 |
| 11 | 77.5 | 120 | 10 | 1.7 | 44 | 2500 |
| 12 | 80 | 120 | 10 | 1.8 | 46 | 3700 |
| 13 | 90 | 120 | 10 | 1.9 | 48 | 4000 |
| 14 | 100 | 120 | 10 | 1.9 | 51 | 4200 |
| 15 | 100 | 60 | 10 | 1.9 | 49 | 4010 |
| 16 | 100 | 80 | 10 | 1.9 | 47 | 3800 |
| 17 | 100 | 100 | 10 | 1.9 | 48 | 4050 |
| 18 | 100 | 140 | 10 | 1.9 | 47 | 3800 |
| 19 | 100 | 160 | 10 | 1.9 | 45 | 3400 |
| 20 | 100 | 120 | 1 | 1.9 | 51 | 4200 |
| 21 | 100 | 120 | 2 | 1.9 | 51 | 4200 |
| 22 | 100 | 120 | 3 | 1.9 | 51 | 4200 |
| 23 | 100 | 120 | 5 | 1.9 | 51 | 4200 |
| 24 | 100 | 120 | 8 | 1.9 | 51 | 4200 |
| 25 | 100 | 120 | 10 | 1.9 | 51 | 4200 |
| 26 | 100 | 120 | 12 | 1.9 | 51 | 4200 |
| 27 | 100 | 120 | 20 | 1.9 | 51 | 4200 |
| 28 | 100 | 120 | 30 | 1.9 | 51 | 4200 |
| 29 | 100 | 120 | 100 | 1.9 | 51 | 4200 |
| 30 | 100 | 120 | 1000 | 1.9 | 51 | 4200 |

Figure 3:
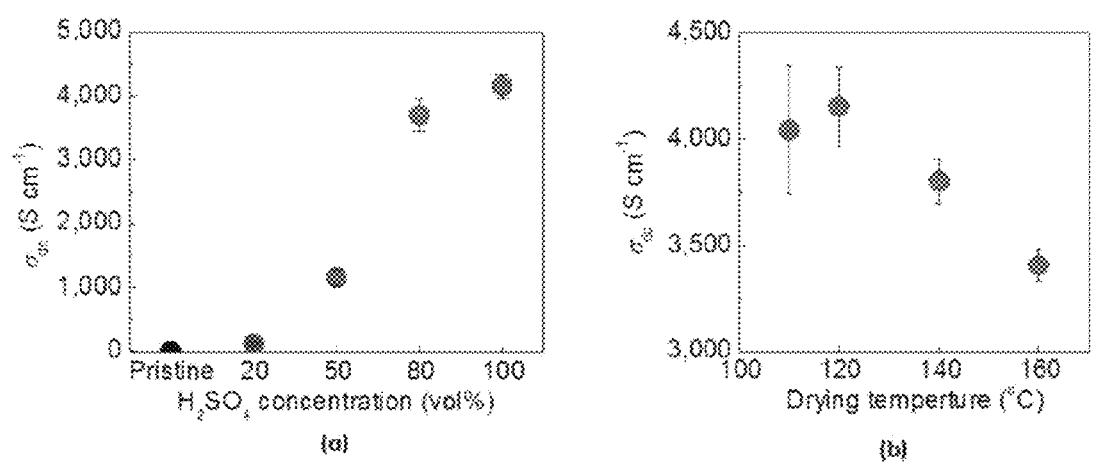
FIG. 3 is a set of graphs showing the changes in electrical conductivity of PEDOT:PSS with a change in sulfuric acid concentration (a) and a change in drying temperature (b).
Figure 4:
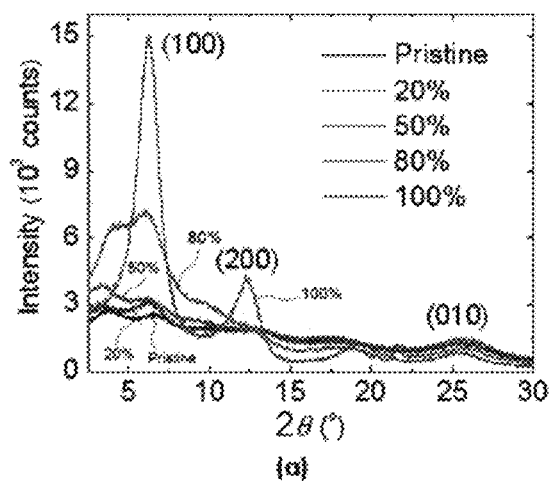
FIG. 4 shows the results of X-ray analysis of the structure of PEDOT:PSS treated with varying concentrations of sulfuric acid (a), and the molecular packing structure of crystalline PEDOT:PSS (b).
Figure 4:
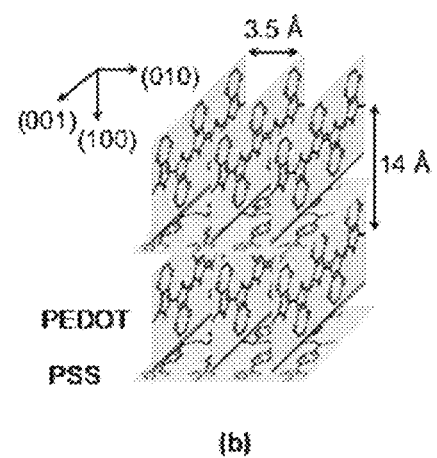

The changes in electrical properties and structures of PEDOT:PSS thin films, which were caused by treatment with varying concentrations of sulfuric acid and sulfuric acid derivatives, were observed (FIGS. 3 and 4).

The electrical conductivity of each thin film increased as the concentration of the treatment solvent increased (sample Nos. 1 to 14 in Table 1). Specifically, the thin film showed an electrical conductivity of less than 1,500 S/cm at a sulfuric acid concentration of 60% or less, but showed electrical conductivities of 2400 S/cm at a sulfuric acid concentration of 75%, 3,700 S/cm at a sulfuric acid concentration of 80%, and 4,380 S/cm (the highest measurement value) at a sulfuric acid concentration of 100% (Table 1 and FIG. 3(a)). The electrical conductivity increased rapidly in the sulfuric acid concentration range of 75 to 80%, and this rapid increase in the electrical conductivity indicates that a significant structural change occurred at a sulfuric acid concentration of 80% or higher.

Figure 6:
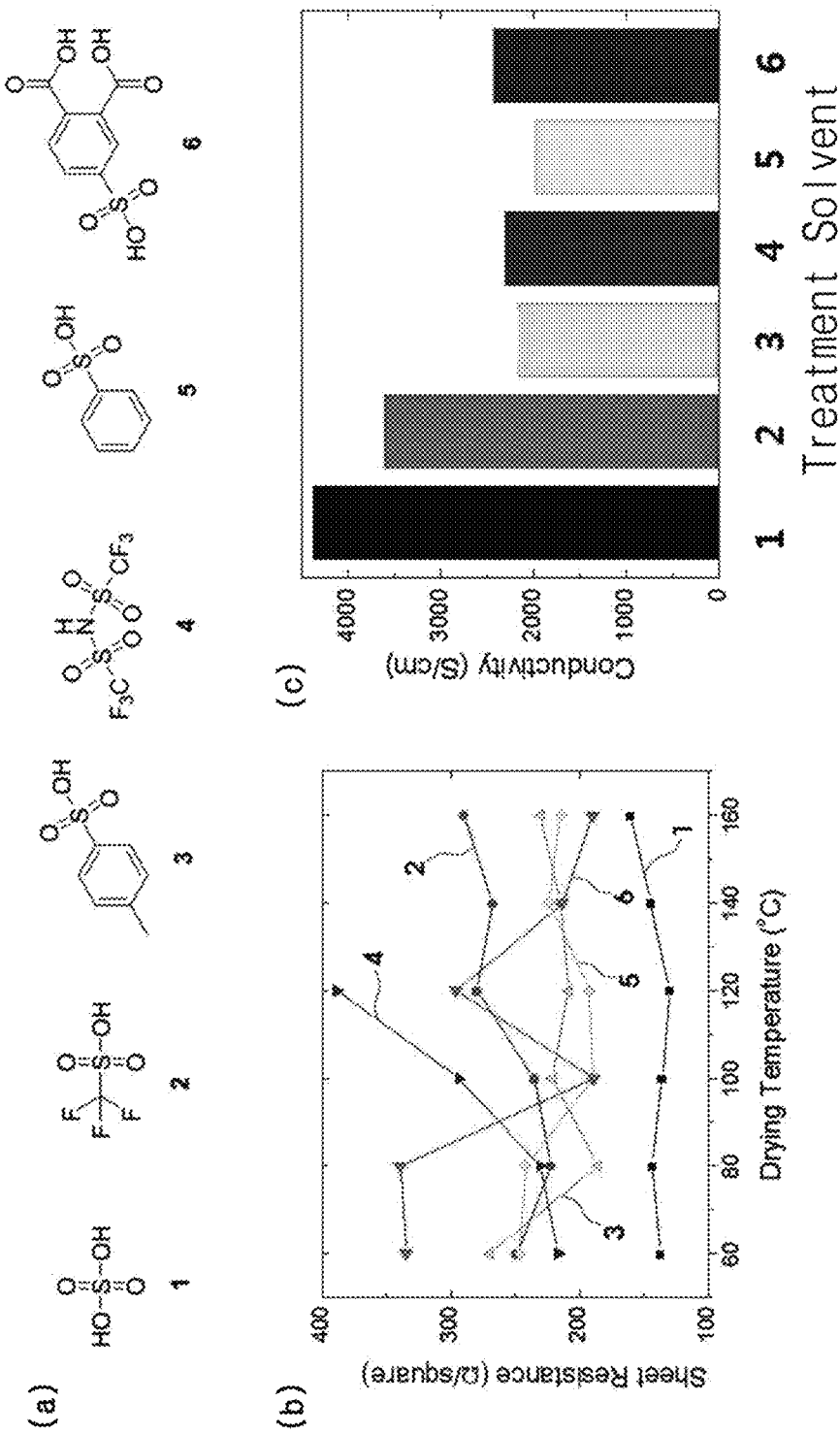
FIG. 6 shows the structural formula of various solvents for the treatment of PEDOT:PSS (a), the sheet resistance value of PEDOT:PSS treated with each of these solvents at varying temperatures (b), and the electrical conductivity value treated with each of these solvents (c).

The results of observing the electrical conductivity while changing the treatment solvent at a solvent concentration of 100% indicated electrical conductivities of 4,380 S/cm (the highest measurement value) for sulfuric acid (1), 3,600 S/cm for trifluoromethanesulfonic acid (2), 2,160 S/cm for p-toluenesulfonic acid (3), 2,300 S/cm for bis(trifluoromethane)sulfonamide (4), 1,980 S/cm for benzenesulfonic acid (5), and 2,420 S/cm for 4-sulfophtalic acid (6) (FIG. 6(c)).

It was shown that not only sulfuric acid, but also the sulfuric acid derivatives having a sulfonic acid functional group, reduced the sheet resistance of PEDOT:PSS and improved the electrical conductivity (FIG. 6(b)).

The electrical conductivity of PEDOT:PSS also changed depending on the drying temperature (sample Nos. 14-19 in Table 1). Specifically, good electrical conductivities higher than 3,800 S/cm were shown in the treatment temperature range of 60 to 160° C. Also, as can be seen in FIG. 3(b), the thin film showed an electrical conductivity of 4,000 S/cm or higher at drying temperatures of 110° C. and 120° C. When the thin film was dried at 120° C., it showed the best electrical conductivity, but when the thin film was dried at a temperature lower or higher than 120° C., the electrical conductivity decreased. The reason for this decrease in electrical conductivity is as follows. At sites remaining after PSS has been uncoupled from PEDOT:PSS, sulfuric acid, a sulfuric acid derivative or water may exist. If the thin film is dried at an excessively high temperature, there will be a problem in that this liquid material evaporates before PEDOT is formed into a crystal, and if the thin film is dried at an excessively low temperature, the liquid material will exist between the PEDOT molecules to interfere with the n-n interaction therebetween.

The change in the electrical conductivity with the time of treatment with the treatment solvent (e.g., sulfuric acid) was observed (sample Nos. 20-30 in Table 1). As a result, it was shown that, when 100% sulfuric acid was used as the solvent, no change in the electrical conductivity was observed, and there was no significant change in the reproducibility. This suggests that the time of treatment with the solvent does not play a crucial role in an increase in the electrical conductivity.

FIG. 4(a) shows the XRD patterns of PEDOT:PSS thin films treated with varying concentrations of sulfuric acid. The XRD pattern of the pristine thin film not treated with sulfuric acid showed four characteristic peaks: $2\theta=3.8°$ (d=23 Å), 6.6° (d=13.4 Å), 17.7° (d=5.0 Å), and 25.6° (d=3.5 Å). Herein, $2\theta=3.8°$ and 6.6° correspond to the two distinct lamellar stacking distance d (100) of PEDOT and PSS, and $2\theta=17.7°$ and 25.6° correspond to the distance d(010) of the amorphous halo of PSS and the PEDOT, respectively (FIG. 4(b)).

As the concentration of sulfuric acid used for treatment increased, the XRD pattern gradually changed. When treatment with 20% and 50% sulfuric acid was performed, the peaks of $2\theta=3.8°$ and 6.6° shifted by about 0.4° to the lower side, and the intensity on the XRD data increased. This suggests that the lamellar stacking distance increased and the degree of crystallinity also increased.

However, consistently with the data of electrical conductivity, a significant change was observed when PEDOT:PSS was treated with 80% sulfuric acid. Specifically, strong peaks were observed at 2θ=4.4° and 6.2° ($d_{(100)}$) and 2θ=9.2° and 13.3° ($d_{(200)}$). Also, when PEDOT:PSS was treated with 100% sulfuric acid, strong peaks appeared at 2θ=6.2° and 2θ=13.3°. The (010) absorption peak indicating the distance between PEDOT molecules decreased as the concentration of sulfuric acid increased, suggesting that the stacking between PEDOT molecules increased. Also, the absorption peak of the (100) plane increased, suggesting that the crystallinity of PEDOT:PSS greatly increased. From such results, it can be seen that, as the concentration of sulfuric acid increases, the crystallinity of PEDOT:PSS increases, and PEDOT:PSS has a preference for two distinct lamellar phases, PEDOT and PSS.

Figure 5:
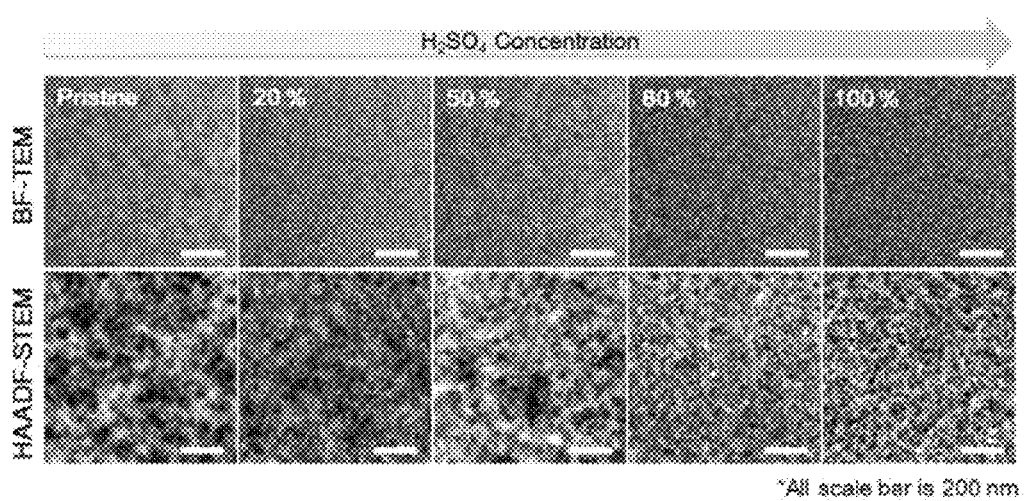
FIG. 5 shows BF (bright field)-TEM images and HAADF-STEM images of PEDOT:PSS thin films treated with varying concentrations of sulfuric acid.

To identify the process in which the structure of PEDOT:PSS changes depending on the concentration of sulfuric acid used for treatment, the BF (bright field)-TEM image and HAADF-STEM (high-angle annular dark-field scanning transmission electron microscope) image of PEDOT:PSS were observed (FIG. 5).

As can be seen in FIG. 5, in the pristine sample not treated with sulfuric acid, a white PEDOT:PSS lump could be observed in the grains. In the samples treated with 20% and 50% sulfuric acid, slightly swollen grains in a spatially dense state were predominantly observed. When the concentration of sulfuric acid increased to 80% or higher, an abrupt change in shape from granular structures to nanofibrillar structures could be observed. In addition, the sample treated with 100% sulfuric acid showed a nanofibrillar width of about 10-15 nm.

This suggests that a high concentration of sulfuric acid induced the reconstitution of the PEDOT:PSS complex to form crystalline nanofibrils, thereby forming an excellent PEDOT network.

The treatment of the PEDOT:PSS thin film with sulfuric acid PEDOT:PSS resulted in a change in the composition of the thin film, and this change could be confirmed by observing the absorption spectrum.

Referring to FIG. 7(a)), strong absorption peaks in the UV region are attributable to the influence of the phenyl group of PSS, and broad absorption bands in the visible and IR regions are associated with the free charges of PEDOT. When the thin film was treated with 80% sulfuric acid, two strong absorption peaks in the UV region significantly decreased, but there was no change in the absorption characteristics at a lower energy level (<3.0 eV). Such results suggest that, when PEDOT:PSS is treated with a high concentration of sulfuric acid, only PSS is selectively removed without influencing PEDOT. Thus, it can be seen that, as the concentration of sulfuric acid increases, the "charge-separated transition state" as described above is induced, and thus PSS is separated from PEDOT:PSS. When the PEDOT:PSS thin film was treated with 100% sulfuric acid, 70% or more of PSS was removed.

This change in the PSS content led to the increase in charge density (n) (FIG. 7(c)) by an increase in the molar ratio of PEDOT to PSS (FIG. 7(a)). The molar ratio ($R_M$) of PEDOT to PSS of the pristine sample not treated with sulfuric acid was PEDOT/PSS=1/1.9 (corresponding to a weight ratio of about 1/2.5 (w/w)), but the molar ratio ($R_M$) of PEDOT to PSS of the sample treated with 100% sulfuric acid was PEDOT/PSS=about 1/0.5 (corresponding to a weight ratio of about 1/0.7 (w/w)).

As can be seen in Table 1, treatment with 75% sulfuric acid showed a molar ratio of PEDOT to PSS of 1.6, and treatment with 80% sulfuric acid showed a molar ratio of PEDOT to PSS of 1.8, and treatment with 100% sulfuric acid showed a molar ratio of PEDOT to PSS of 1.9 (about 2.0).

The change in the PSS content also led to the increase in charge mobility (μ) (FIG. 7(d)) by an increase in the degree of crystallinity ($X_C$) (samples Nos. 1 to 14 in Table 1; FIG. 7(d)). Thus, it can be seen that structural changes such as an increase in the crystallinity of PEDOT:PSS also influenced an increase in the electrical conductivity.

As can be seen in Table 1 above, treatment with 75% sulfuric acid showed a degree of crystallinity of 40%, and treatment with 80% sulfuric acid showed a degree of crystallinity of 46%, and treatment with 100% sulfuric acid showed a degree of crystallinity of 51%.

To evaluate the electrode performance of the PEDOT:PSS thin film fabricated as described above, the figure of merit of the thin film was calculated.

Figure 8:
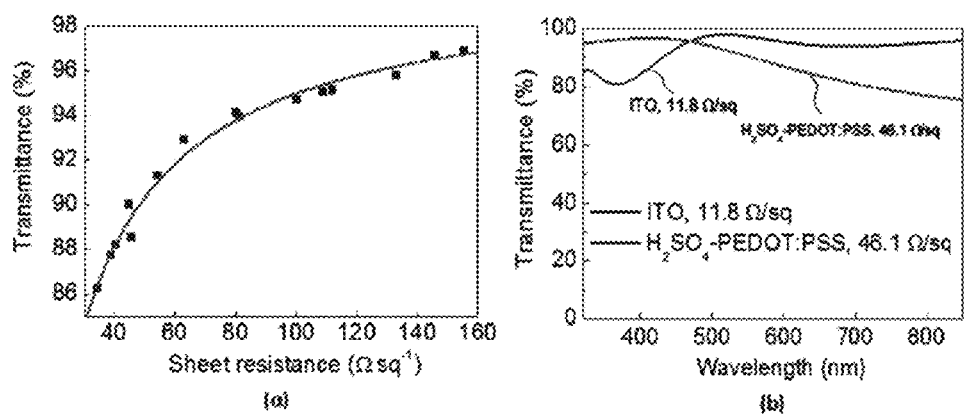
FIG. 8 is a set of graphs showing the transmittance versus sheet resistance (a) and transmittance versus wavelength (b) of a PEDOT:PSS-based electrode according to an embodiment of the present disclosure.

The figure of merit ($\sigma_{dc}/\sigma_{op}$) can be calculated using the following equation:

$$\%T(\lambda) = \left(1 + \frac{Z_0}{2R_s} \frac{\sigma_{op}(\lambda)}{\sigma_{dc}}\right)^{-2} \times 100$$

wherein $Z_0$ is a constant, and figure of merit ($\sigma_{dc}/\sigma_{op}$) can be calculated by substituting the transmittance (% T) at a wavelength (λ) of 550 nm and the sheet resistance (Rs) into the above equation. In FIG. 8(a), the sheet resistance versus transmittance results obtained for sulfuric acid-treated PEDOT:PSS thin films having varying thicknesses are shown as square dots, and a curve was plotted by fitting the above equation to the results. As a result, a mean figure of merit of 72.2 could be obtained. This value is the highest among the figures of merit of electrically conductive polymer thin films reported to date. For reference, the sheet resistance (Rs) at % T=90% was 46.1 Ω/sq.

Fabrication Example 2

Fabrication of Polymer Solar Cell

Using a 100% sulfuric acid ($H_2SO_4$)-treated PEDOT:PSS thin film (sample No. 14) as an anode, a polymer solar cell having a structure of glass/anode/PEDOT:PSS (30 nm)/PTB7:$PC_{71}$BM (90 nm)/Ca (20 nm)/Al (100 nm) was fabricated.

For comparison, using ITO as an anode, a polymer solar cell having the same structure as that of the above solar cell was fabricated.

An aqueous solution of PEDOT:PSS (Clevios P AI 4083) different from the PEDOT:PSS used for the anode was used for the hole transport layer (HTL). The hole transport layer (HTL) was spin-coated on each electrode and dried at 140° C. for 10 minutes. Then, a solution of a mixture of PTB7 and $PC_{71}$BM (1:1.5 by wt %) in chlorobenzene containing 3 vol % of 1,8-diiodooctane was spin-cast on the PEDOT:PSS layer and dried in a nitrogen-filled glove box at a temperature of 70° C. for 10 minutes. Finally, Ca and Al were thermally deposited under a high-vacuum condition (4>$10^{-7}$ Torr).

Analysis Example 2

Analysis of Characteristics of Polymer Solar Cells

The results of evaluating the performance of the organic thin film solar cell comprising each of the 100 vol % sulfuric acid-treated PEDOT:PSS thin film (sample No. 14) and ITO as an electrode are summarized in Table 2 below.

As can be seen in Table 2, the open circuit voltage ($V_{oc}$), short circuit voltage ($J_{sc}$), fill factor (FF) and photoelectric conversion efficiency (PCE) of the sulfuric acid-treated PEDOT:PSS thin film were all comparable to those of the ITO electrode.

TABLE 2

| Anode | $V_{OC}$ (V) | $J_{SC}$ (mA·cm$^{-1}$) | FF | PCE (%) |
|---|---|---|---|---|
| ITO | 0.73 | 14.5 | 0.68 | 7.2 |
| $H_2SO_4$-PEDOT:PSS | 0.73 | 13.9 | 0.65 | 6.6 |

Figure 9:
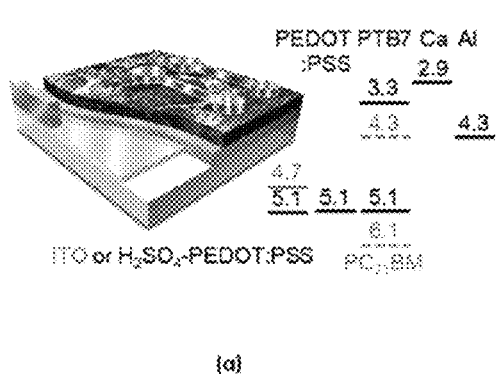
FIG. 9 shows a comparison of performance between a solar cell having a PEDOT:PSS-based electrode and a solar cell having an ITO electrode (a), and is a graph showing the current density versus voltage curve of each of the solar cells (b).
Figure 9:
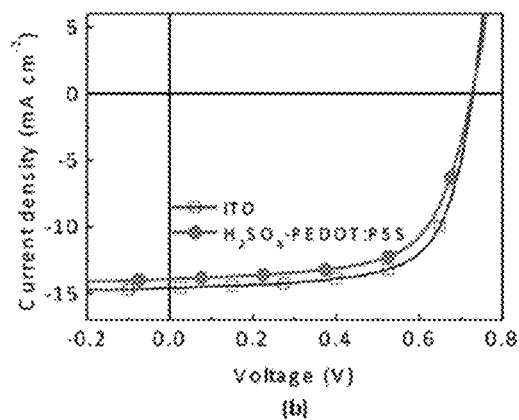

As can be seen in Table 2 above, when the 100% sulfuric acid-treated PEDOT:PSS thin film according to the present disclosure was used as the anode, it showed a sheet resistance of 46.1 Ω/sq and a transmittance of 90% or more (at an absorption wavelength of 550 nm). The organic solar cell fabricated using this plastic electrode showed an energy conversion efficiency that is almost similar (>95%) to that of the organic solar cell fabricated using ITO. Thus, the sulfuric acid-treated PEDOT:PSS thin film showed a high potential for use as a printed plastic electrode in place of ITO (FIG. 9).

Fabrication Example 3

Fabrication of Polymer Light-Emitting Device

Using a 100% sulfuric acid ($H_2SO_4$)-treated PEDOT:PSS thin film (sample No. 14) as an anode, a polymer light-emitting device having a structure of glass/anode/aryl-substituted poly(para-phenylene vinylene) derivative (P-PPV) (60 nm)/Ca (20 nm)/Al (100 nm) was fabricated.

For comparison, a polymer light-emitting device was fabricated in the same manner as described above, except that ITO was used for the anode and that PEDOT:PSS (30 nm) was additionally coated on the anode to form a hole transport layer (HTL).

The hole transport layer (HTL) was spin-coated and dried at 140° C. for 10 minutes.

A solution of P-PPV (0.5 wt %) in toluene was spin-cast on each electrode and dried in a nitrogen-filled glove box at a temperature of 80° C. for 10 minutes. Finally, Ca and Al were thermally deposited under a high-vacuum condition ($4 \times 10^{-7}$ Torr).

Analysis Example 3

Analysis of Characteristics of Polymer Light-Emitting Device

Figure 10A:
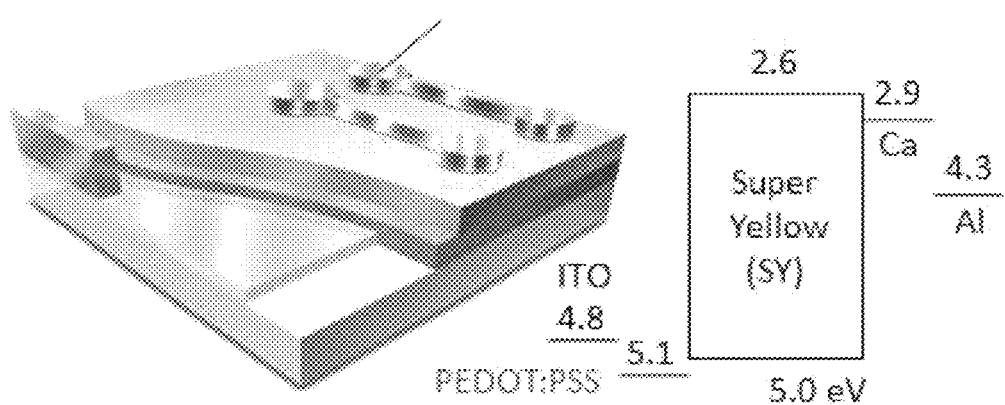
FIG. 10a shows the structure of a light-emitting device having a PEDOT:PSS-based electrode according to an embodiment of the present disclosure and a light-emitting device having an ITO electrode.

An LED structure is a structure obtained by coating a photoactive layer on an ITO electrode coated with a PEDOT:PSS hole transport layer and depositing Ca and Al thereon (a comparative example), or a structure obtained by coating a photoactive layer on a 100% sulfuric acid-treated PEDOT:PSS electrode, which also functions as a hole transport layer, and depositing Ca and Al thereon (an example of the present disclosure). FIG. 10a briefly shows the energy level of each layer.

Figure 10B:
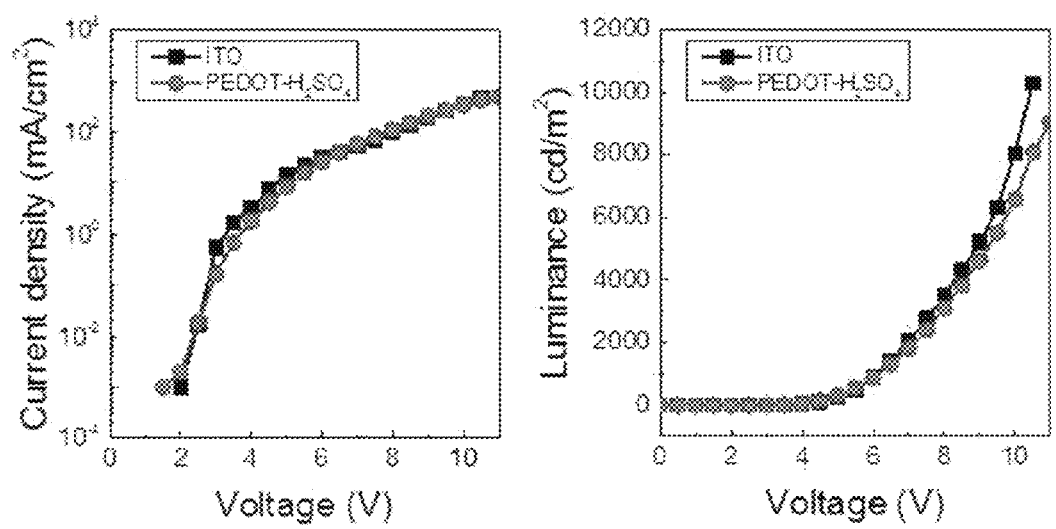
FIG. 10b shows a comparison of performance between a light-emitting device having a PEDOT:PSS-based electrode according to an embodiment of the present disclosure and a light-emitting device having an ITO electrode.

The sulfuric acid-treated PEDOT:PSS electrode (PEDOT-$H_2SO_4$) showed LED electrode characteristics comparable to those of the ITO electrode (FIG. 10b). In addition, the PEDOT:PSS electrode has an advantage in that it does not require a hole transport layer, unlike the ITO electrode.

As described above, according to the present disclosure, electrical conductivity comparable to that of ITO was realized by controlling the concentration of sulfuric acid ($H_2SO_4$) or the sulfuric acid derivative, the treatment temperature and the specific fabrication process conditions to induce the crystallization of the PEDOT:PSS thin film. It was found that this electrical conductivity was achieved by the separation of PSS resulting from the "charge-separated transition state".

The PEDOT:PSS thin film according to the present disclosure can be used in electronic devices. For example, it can be applied to various fields, including field effect transistors, thin film transistors, optical sensors, light-emitting devices, optical detectors, optical magnetic memory devices, flat panel displays, flexible devices, solar cells, EL (electroluminescence) devices, PL (photoluminescence) devices, CL (cathodeluminescence) devices, supercapacitors, electrochromic devices, etc. Particularly, it will be used as a transparent electrode in optical devices such as solar cells and light-emitting devices.

As described above, according to the present disclosure, there can be provided a PEDOT:PSS-based electrode that can exhibit electrical properties comparable to those of an ITO electrode while having the advantages of electrically conductive polymers, including processability, lightweight, flexibility, a simple coating process, low production costs, etc., a method for fabricating the PEDOT:PSS-based electrode, and an organic electronic device comprising the PEDOT:PSS-based electrode.

While various embodiments have been described above, it will be understood to those skilled in the art that the embodiments described are by way of example only. Accordingly, the disclosure described herein should not be limited based on the described embodiments.

What is claimed is:

1. A method for fabricating a PEDOT:PSS-based electrode, comprising the steps of:
   preparing a PEDOT:PSS thin film formed on a substrate;
   treating the thin film with a solution containing 75-100 vol % of sulfuric acid or a sulfuric acid derivative;
   separating the thin film from the solution and rinsing the separated thin film; and
   drying the rinsed thin film at a temperature between 60° C. and 160° C.

2. The method of claim 1, wherein the step of treating the thin film with the solution is performed for 1 minute or more.

3. The method of claim 1, wherein the step of separating the thin film from the solution and rinsing the separated thin film is performed to remove the sulfuric acid or sulfuric acid derivative attached to a surface of the PEDOT:PSS thin film or remove PSS separated from PEDOT:PSS.

4. The method of claim 1, wherein the step of separating the thin film from the solution and rinsing the separated thin film is performed using water.

5. The method of claim 1, wherein the step of treating the thin film with the solution is performed by immersing the thin film in the solution containing 75-100 vol % of the sulfuric acid or sulfuric acid derivative.

6. The method of claim 1, wherein the sulfuric acid or sulfuric acid derivative is selected from the group consisting of methansulfonic acid, trifluoromethansulfonic acid, sulfuric acid, perchloric acid, benzenesulfonic acid, p-toluenesulfonic acid, 4-ethylbenzenesulfonic acid, 4-sulfophthalic acid, p-xylene-2-sulfonic acid hydrate, 5-amino-1-naphthalenesulfonic acid, 8-amino-2-naphthalenesulfonic acid, 4-amino-2-naphthalenesulfonic acid, taurine, 1,4-butanedisulfonic acid, sulfurous acid, bis(trifluoromethane)sulfonamide), and a mixture of two or more thereof.

7. The method of claim 1, wherein the substrate is made of a material selected from the group consisting of glass, quartz, $Al_2O_3$ and SiC.

8. A PEDOT:PSS-based electrode comprising:
a substrate; and
an electrode composed of a PEDOT:PSS thin film formed on the substrate,
wherein the PEDOT:PSS thin film has a molar ratio of PEDOT to PSS of 1.6-2.0 and a degree of crystallinity of 40% or higher.

9. An organic electronic device having a PEDOT:PSS-based electrode, the organic electronic device comprising:
a substrate;
a first electrode composed of a PEDOT:PSS thin film formed on the substrate;
a photoactive layer disposed on the first electrode; and
a second electrode disposed on the photoactive layer,
wherein the PEDOT:PSS thin film has a molar ratio of PEDOT to PSS of 1.6-2.0 and a degree of crystallinity of 40% or higher.

10. The organic electronic device of claim 9, wherein the photoactive layer is a light-emitting layer or a photoelectric conversion layer.

\* \* \* \* \*